United States Patent
Yang et al.

(10) Patent No.: US 6,635,580 B1
(45) Date of Patent: Oct. 21, 2003

(54) APPARATUS AND METHOD FOR CONTROLLING WAFER TEMPERATURE IN A PLASMA ETCHER

(75) Inventors: R. Y. Yang, Taipei (TW); T. Y. Chen, Chu-Pei (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 09/283,037

(22) Filed: Apr. 1, 1999

(51) Int. Cl.[7] .................... H01L 21/302; H01L 21/461
(52) U.S. Cl. .................. 438/715; 438/706; 438/707; 438/710; 438/714; 118/728; 118/69; 156/345.53
(58) Field of Search .................. 438/706, 707, 438/710, 714, 715; 118/723 VE, 728, 69, 900; 62/338; 156/345.43

(56) References Cited

U.S. PATENT DOCUMENTS

| | | | | |
|---|---|---|---|---|
| 4,565,601 A | * | 1/1986 | Kakehi et al. | 156/643 |
| 4,949,783 A | * | 8/1990 | Lakios et al. | 165/80.1 |
| 5,267,607 A | * | 12/1993 | Wada | 165/80.1 |
| 5,320,982 A | * | 6/1994 | Tsubone et al. | 438/714 |
| 5,622,593 A | * | 4/1997 | Arasawa et al. | 156/345 |
| 5,676,205 A | * | 10/1997 | White | 165/275 |
| 5,990,016 A | * | 11/1999 | Kim et al. | 438/707 |
| 6,140,612 A | * | 10/2000 | Husain et al. | 219/390 |
| 6,174,408 B1 | * | 1/2001 | Kadomura et al. | 156/345 |

* cited by examiner

Primary Examiner—Amir Zarabian
Assistant Examiner—Jeff Vockrodt
(74) Attorney, Agent, or Firm—Tung & Associates

(57) ABSTRACT

An apparatus for controlling wafer temperature in a plasma etcher during a plasma-on state and a method for using such apparatus are disclosed. In the apparatus, an additional temperature sensor for sensing the wafer backside temperature and a second flow control valve of a mass flow controller are utilized such that the second flow control valve may be opened to increase the flow of cooling gas through the wafer backside when a temperature rise is detected by the temperature sensor. When the wafer temperature detected is too high, i.e., higher than 65° C., the second flow control valve is opened to increase the flow of helium cooling gas from a nominal rate of 13 sccm by at least 50%. When the temperature of the wafer detected is below 65° C., the flow of the helium cooling gas can be reduced by closing the second flow control valve.

8 Claims, 2 Drawing Sheets

APPARATUS AND METHOD FOR CONTROLLING WAFER TEMPERATURE IN A PLASMA ETCHER

FIELD OF THE INVENTION

The present invention generally relates to an apparatus for controlling wafer temperature in a plasma etcher and a method for using such apparatus and more particularly, relates to an apparatus for controlling wafer temperature in a plasma etcher during a plasma-on state which includes a temperature sensor for sensing the wafer temperature and a flow control valve for increasing or decreasing helium flow rate in a helium cooling loop and a method for using such apparatus.

BACKGROUND OF THE INVENTION

In the fabrication of modem integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 $\mu$m or less for use in high-density logic devices. For instance, in forming tungsten plugs by a chemical vapor deposition method, via holes in such small dimensions must be formed by etching through layers of oxide and spin-on-glass materials at a high etch rate. A high-density plasma etching process, utilizing a fluorine chemistry is frequently used in the via formation process.

The via hole formation process can be enhanced by improving the etch directionality by a mechanism known as sidewall passivation to improve the anisotropy of the etching process. By utilizing a suitable etchant gas and reactor parameters, an etch-inhibiting film, normally of a polymeric nature, can be formed on vertical sidewalls. The etch-inhibiting film or the polymeric film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of a polymeric film on the sidewalls. After the sidewall is coated with a polymeric film, it is protected by the inhibitor film to preserve the line width or via hole diameter control.

In a modem etch chamber, an electrostatic wafer holding device, i.e., an electrostatic chuck or commonly known as an E-chuck, is frequently used in which the chuck electrostatically attracts and holds a wafer that is positioned on top. The E-chuck holding method is highly desirable in the vacuun handling and processing of wafers. In contrast to a conventional method of holding wafers by mechanical clamping means where only slow movement is allowed during wafer handling, an E-chuck device can hold and move wafers with a force equivalent to several tens of Torr pressure.

In an etch chamber equipped with a plasma generating device and an electrostatic chuck for holding a wafer, a shadow ring is utilized as a seal around the peripheral edge of the wafer. The shadow ring, sometimes known as a focus ring, is utilized for achieving a more uniform plasma distribution over the entire surface of the wafer and to help restrict the distribution of the plasma cloud to stay only on the wafer surface area. The uniform distribution function is further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is an important function since it prevents the plasma from attacking the hardware components contained in the lower compartment of the etch chamber. In order to survive the high temperature and the hostile environment, the shadow ring is frequently constructed of a ceramic material such as quartz.

A typical inductively coupled plasma etch chamber 10 is shown in FIG. 1. In the etch chamber 10, which is similar to a Lam TCP etcher made by the Lam Research Corp., the plasma source is a transformer-coupled plasma source which generates high-density, low-pressure plasma 12 which is decoupled from the wafer 14. The plasma source allows independent control of ion flux and ion energy. Plasma 12 is generated by a flat spiral coil 16, an inductive coil, which is separated from the plasma by a dielectric plate 18, or a dielectric window on the top of the reactor chamber 20. The wafer 14 is positioned several skin depths away from the coil 16 so that it is not affected by the electromagnetic field generated by the coil 16. There is very little plasma density loss because plasma 12 is generated only a few mean free paths away from the wafer surface. The Lam TCP plasma etcher therefore enables a high-density plasma and high-etch rates to be achieved. In the plasma etcher 10, an inductive supply 22 and a bias supply 24 are used to generate the necessary plasma field. Multi-pole magnets 26 are used surrounding the plasma 12 generated. A wafer chuck 28 is used to hold the wafer 14 during the etching process. A ground 30 is provided to one end of the inductive coil 16.

In a typical inductively coupled RF plasma etcher 10 shown in FIG. 1, a source frequency of 13.56 MHZ and a substrate bias frequency of 13.56 MHZ are utilized. An ion density of approximately $0.5\sim2\times10^{12}$ $cm^3$ at wafer, an electron temperature of 3.5~6 eV and a chamber pressure of 1~25 m Torr are achieved or used.

In the typical plasma etch chamber 10, a cooling means for the wafer backside is provided in an E-chuck for controlling the wafer temperature during the plasma processing. This is shown in FIG. 2 for the plasma etcher 40. In the conventional plasma etcher 40, E-chuck 42 is provided for supporting a wafer 44 thereon. E-chuck 42 can be constructed of either a metallic material or of a polymeric material. A plurality of ventilation apertures (not shown) are provided in the E-chuck surface such that a cooling gas can be supplied to the backside 46 of the wafer 44 during plasma processing. The plurality of ventilation apertures in the E-chuck 42 is connected in fluid communication with a cooling gas inlet conduit 38 for feeding a cooling gas into the apertures. The cooling gas inlet conduit 38 is in turn connected to a gas supply line 36, a flow control valve 34 and a cooling gas supply 32. The pressure in the cooling gas supply line 36 is monitored by a pressure sensing device 48 which in turn sends a signal 50 to a controller 52. The controller 52, after receiving signal 50 and comparing to a pre-stored value, sends signal 54 to the flow control valve 34 for opening or closing the valve and thus increasing or decreasing the cooling gas supply through the supply line 36, 38 into the E-chuck 42. The amount of the cooling gas that is supplied to the E-chuck 42 is further adjusted by a needle valve 56 and pumped away by a pump 58.

As shown in FIG. 2, the conventional method for controlling the E-chuck temperature and the wafer temperature is ineffective since there is no feedback control loop for achieving an efficient control of the cooling gas pressure that flown through the E-chuck 42. The temperature of the wafer 44 during plasma processing can not be detected and thus, the temperature can exceed a critical limit to cause a detrimental effect on the coating layers on the wafer. For instance, during a plasma etching process conducted on a dielectric layer, the wafer temperature can increase to such an extent that a photoresist layer coated on the wafer starts to flow during the plasma-on period. The lack of precise control on the wafer temperature in a plasma etcher therefore leads to severe processing difficulties and produces low yield of the wafer.

A test conducted and data obtained on an E-chuck equipped with conventional cooling apparatus is shown in Table 1.

TABLE 1

| E-Chuck temperature (E) | Wafer temperature (W) | Deviation (W − E) |
| --- | --- | --- |
| Metal (45° C.) | 78° C. | 33° C. |
| Poly (65° C.) | 75° C. | 10° C. |

As shown in Table 1, the wafer positioned on the conventional E-chuck rises to a significantly higher temperature during plasma-on that it is impossible to control the wafer temperature only by using the backside cooling gas. The backside cooling gas used can be any inert gas. This is the case when the heat-transfer medium flown between the wafer and the E-chuck is a helium gas, with the chamber pressure in the mini-Torr range and the backside helium pressure in the Torr range during the plasma-on state. When the backside helium cooling gas fails to effectively cool the wafer, a photoresist layer coated on the wafer may flow due to the excessive temperature during the plasma-on state.

Table 1 shows data obtained in two separate tests of poly and metal etch. Thermal dots are placed on the wafer to measure the maximum wafer temperature at specific locations during the plasma-on, or plasma-struck state. The results indicate that, for metal etching, a large temperature differential between the E-chuck and the wafer exists, i.e., as high as 33° C. During the poly etch process, a smaller temperature difference of 10° C. is observed. These data indicates that during the metal etching process, a temperature differential of 33° C. must be accounted for, i.e., or must be controlled. When not controlled, the excessively high temperature affects the etch rate, the uniformity of etching, and the etch profile obtained. Moreover, when the wafer temperature is higher than 80° C., a photoresist layer on the wafer may flow and thus causing the scrap of the entire wafer.

It is therefore an object of the present invention to provide an apparatus for controlling wafer temperature in a plasma etcher during a plasma-on state that does not have the drawbacks or shortcomings of the conventional control apparatus.

It is another object of the present invention to provide an apparatus for controlling wafer temperature in a plasma etcher during a plasma-on state that can be utilized in either a metal etching, a poly etching or a dielectric etching process.

It is a further object of the present invention to provide an apparatus for controlling wafer temperature in a plasma etcher during a plasma-on state which includes a temperature sensor for sensing the temperature of the wafer backside.

It is still another object of the present invention to provide an apparatus for controlling wafer temperature in a plasma etcher during a plasma-on state that includes a temperature sensor for sensing the wafer backside temperature and a flow control valve for increasing or decreasing the flow of cooling gas to the backside of the wafer.

It is yet another object of the present invention to provide an apparatus for controlling wafer temperature in a plasma etcher during a plasma-on state by utilizing a helium cooling loop that includes a first flow control valve, a first and second plurality of ventilation apertures and a second flow control valve.

It is another further object of the present invention to provide a method for controlling a wafer temperature in a plasma etcher during a plasma-on state by detecting a temperature of the wafer backside during plasma processing and then opening a flow control valve to increase a cooling gas flow to the backside of the wafer for enhanced cooling of the wafer.

It is yet another further object of the present invention to provide a device for cooling X a wafer during plasma etching that includes a first flow control valve, a second flow control valve, a temperature sensor for sensing wafer backside temperature, and a controller for opening the second flow control valve to increase a cooling gas flow when a temperature rise on the wafer backside is detected.

SUMMARY OF THE INVENTION

In accordance with the present invention, an apparatus for controlling wafer temperature in a plasma etcher during a plasma-on state and a method for using such apparatus are disclosed.

In a preferred embodiment, an apparatus for controlling wafer temperature in a plasma etcher during a plasma-on state can be provided which includes an E-chuck for holding a wafer thereon, a first and second plurality of ventilation apertures in the E-chuck for flowing a cooling gas into and out of a cavity formed between the E-chuck and the wafer, a gas inlet conduit for feeding a cooling gas to the cavity through the first plurality of ventilation apertures, a gas outlet conduit for exhausting the cooling gas from the cavity through the second plurality of ventilation apertures, a first flow control valve in the gas inlet conduit, a second flow control valve in the gas outlet conduit, a thermal sensor mounted in the E-chuck for sending a signal indicative of a temperature of the cooling gas in the cavity to a controller, and a controller for opening the second flow control valve and for increasing the cooling gas flow when a temperature rise in the cooling gas is detected.

In the apparatus for controlling wafer temperature in a plasma etcher, the apparatus may be used to control the temperature of the wafer during a plasma-on state. The apparatus may further include a pump in fluid communication with the second flow control valve for evacuating the cooling gas. The cooling gas used may be an inert gas, or may be helium. The first flow control valve, the first and second plurality of ventilation apertures and the second flow control valve form a helium cooling loop. The first and second flow control valves are mass flow controllers. The apparatus may further include a pressure gauge in the gas inlet conduit for sensing a gas pressure and sending a signal to the controller. The flow rates through the first and second flow control valves determine a cooling gas leak rate.

The present invention is further directed to a method for controlling a wafer temperature in a plasma etcher during a plasma-on state which can be carried out by the operating steps of first providing an E-chuck which has a first and second plurality of vent holes therethrough in fluid communication with a cavity formed between the E-chuck and a wafer positioned thereon, flowing a cooling gas into the first plurality of vent holes through a first flow control valve, flowing the cooling gas out of the second plurality of vent holes through a second flow control valve, detecting a temperature of the cooling gas in the cavity by a thermal sensor, and adjusting a cooling gas flow rate through the cavity by adjusting the second flow control valve to change the temperature of the cooling gas.

The method for controlling a wafer temperature in a plasma etcher during a plasma-on state may further include the step of controlling a temperature of the cooling gas by a controller. The method may further include the step of withdrawing the cooling gas from the second flow control valve by a pump. The method may further include the steps of switching on an RF power for the plasma source and opening the second flow control valve to cool the wafer. The method may further include the step of supplying a helium gas as the cooling gas, the step of positioning a wafer on the E-chuck before switching on the E-chuck, or the step of sensing a pressure in the first flow control valve by a pressure sensor and sending a signal to a controller.

The present invention is still further directed to a device for cooling a wafer during plasma etching which includes a first flow control valve for controlling a cooling gas flown into an E-chuck, a second flow control valve for controlling a cooling gas flown out of the E-chuck, a temperature sensor for sensing a temperature of the wafer being plasma etched, and a controller for opening the second flow control valve and for increasing the cooling gas flow when a temperature rise in the wafer is detected.

In the device for cooling a wafer during plasma etching, the cooling gas utilized may be a helium gas. The first and second flow control valves may be mass flow controllers. The device may further include a pump for evacuating the cooling gas from the E-chuck.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus for controlling wafer temperature in a plasma etcher during a plasma-on state which includes a temperature sensor mounted in an electrostatic chuck for sensing a wafer backside temperature and for sending a signal to a controller, and a second flow control valve for opening a passage for cooling gas withdrawn from the electrostatic chuck such that the cooling efficiency of the chuck can be enhanced and a high temperature on the wafer surface can be reduced.

The electrostatic chuck is provided with a first and a second plurality of ventilation apertures in the chuck for flowing a cooling gas into and out of a cavity formed between the electrostatic chuck and the wafer backside. The apparatus further includes a first flow control valve for controlling an inlet flow of a cooling gas into the electrostatic chuck and a controller for determining a flow rate differential between the first flow control valve and the second flow control valve. The differential can be increased when more efficient cooling of the electrostatic chuck is desired.

The present invention further discloses a method for controlling a wafer temperature in a plasma etcher during a plasma-on state by first sensing a wafer backside temperature by a temperature sensor, feeding a signal of the temperature detected into a controller, and then sending a signal from the controller to a flow control valve to open or close the valve such that the flow rate of a cooling gas for cooling the backside of the wafer can be increased or decreased for adjusting the temperature of the wafer.

The present invention also discloses a device for cooling a wafer during plasma etching which includes a first and a second flow control valve for controlling a cooling gas flown into and out of an electrostatic chuck, a temperature sensor for sensing a temperature of the wafer backside, and a controller for opening the second flow control valve such that the cooling gas flow can be increased when a temperature rise in the wafer backside is detected.

Figure 1:
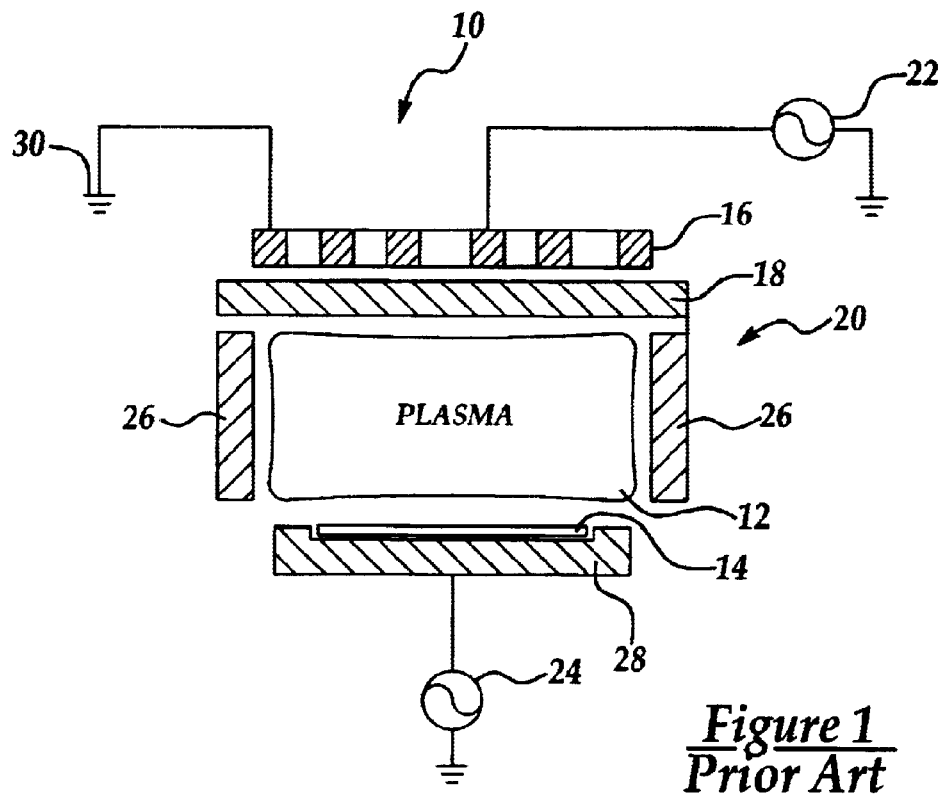
FIG. 1 is a cross-sectional view of a conventional plasma etching apparatus.
Figure 2:
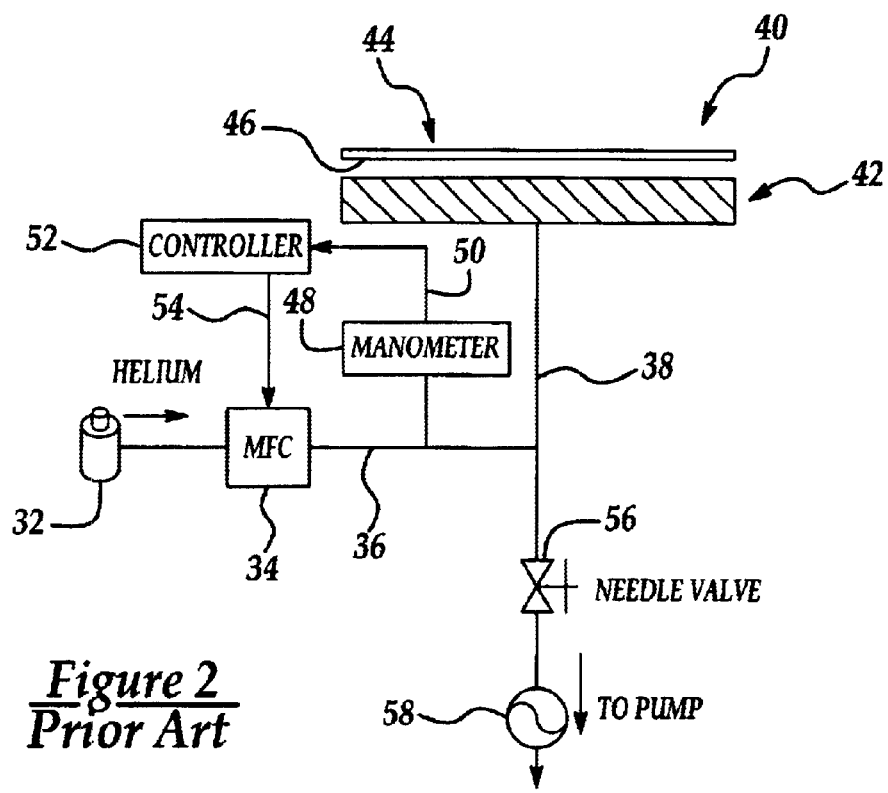
FIG. 2 is an illustration of a conventional electrostatic chuck for supporting a wafer and a temperature control device for the chuck.
Figure 3:
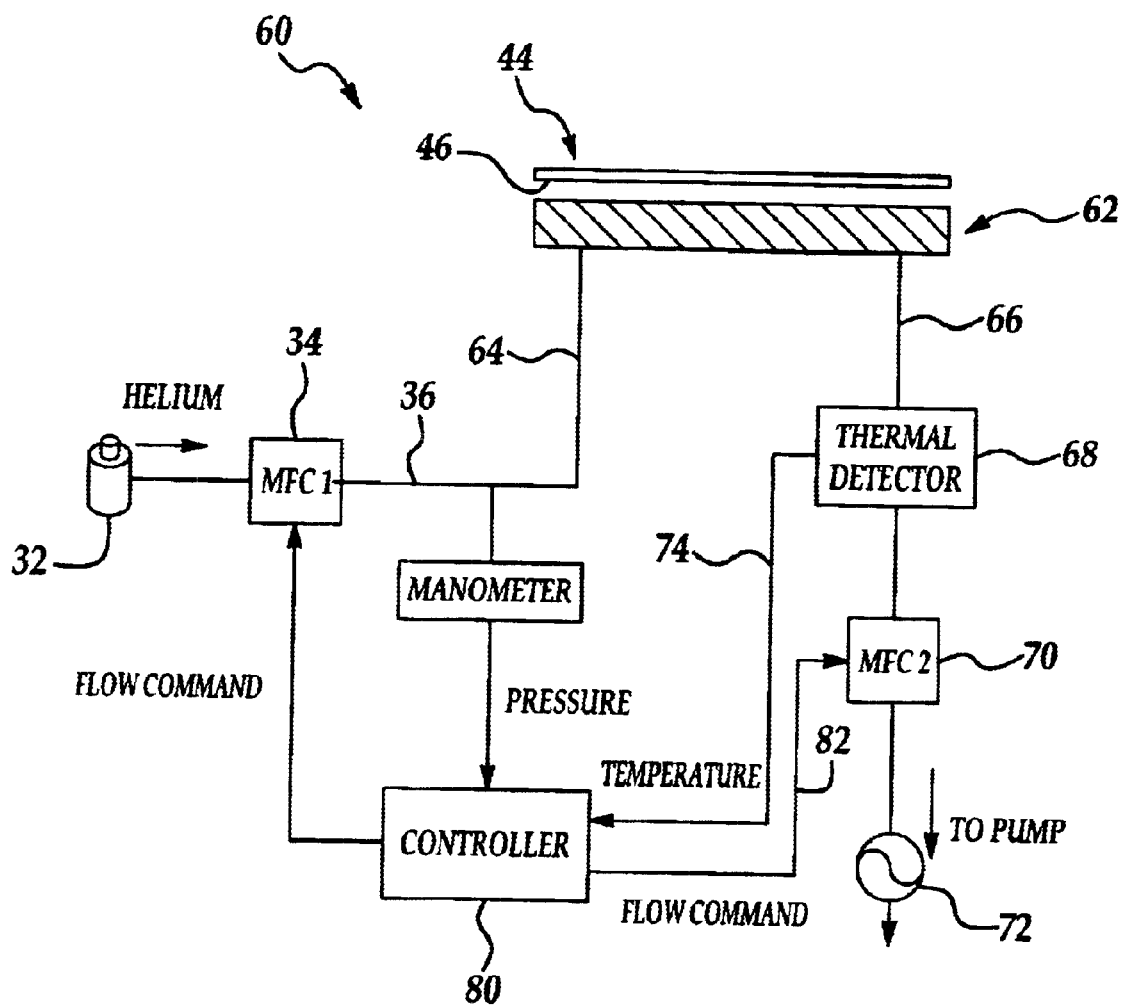
FIG. 3 is an illustration of a present invention apparatus for controlling wafer temperature in a plasma etcher. utilizing a thermal sensor and a second flow control valve.

Referring now to FIG. 3 wherein a present invention temperature control apparatus 60 is shown. In the temperature control apparatus 60, the electrostatic chuck 62 is provided with a first and a second plurality of ventilation apertures (not shown) such that the first plurality of ventilation apertures are in fluid communication with a cooling gas inlet conduit 64 which is fed a cooling gas from a cooling gas supply 32, through a first flow control valve 34 and a conduit 36. The second plurality of ventilation apertures is in fluid communication with a cooling gas outlet conduit 66 which is connected to a temperature sensor 68 for sensing the temperature of the cooling gas returned from the backside 46 of the wafer 44. The cooling gas outlet conduit 66 is further controlled by a second flow control valve 70 for evacuation by a pump 72. The temperature sensor 68 detects the temperature of the cooling gas returned from the backside of the wafer and then sends a signal 74 to a controller 80. Simultaneously, the flow pressure in the cooling gas inlet conduit 36 is detected and a signal is sent to the controller 80 for determining a flow rate and comparing to a flow rate of the second flow control valve 70. When a temperature rise in the wafer backside cooling gas is detected, the controller 80 sends a signal 82 to the second flow control valve, i.e., a mass flow controller 70 to open the valve such that a larger volume of cooling gas may flow through the gas outlet conduit 66. The cooling efficiency of the wafer backside 46 is therefore improved and the temperature of the wafer 44 may be reduced.

The operation of the present invention novel apparatus can thus be described as follows:

1. A wafer is first positioned on the electrostatic chuck, the electrostatic chuck is then switched on.
2. Servo pressure is preset to a set point by adjusting the first flow control valve 34 and the second flow control valve 70. A backside helium flow rate, i.e., a leak rate can be determined by the flow rate difference detected by the two flow control valves.
3. A plasma RF power supply is switched on. The wafer backside temperature increases which is detected by the temperature sensor 68 by sensing a helium temperature rise.
4. The first flow control valve 34 and the second flow control valve 70 are opened to increase the cooling gas flow to cool the wafer backside.

The present invention novel apparatus is therefore capable of controlling a wafer temperature by a helium cooling loop that utilizes an additional temperature sensor and a second flow control valve.

The present invention novel apparatus and a method for utilizing such apparatus have been amply described in the above descriptions and in the appended drawing of FIG. 3.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows.

what is claimed is:

1. An apparatus for controlling wafer temperature in a plasma etcher comprising:

an electrostatic chuck (ESC) for holding a wafer thereon, a first and second plurality of ventilation apertures in said ESC for flowing a cooling gas into and out of a cavity formed between said ESC and said wafer;

a gas inlet conduit for feeding a cooling gas to said cavity through said first plurality of ventialation apertures, a gas outlet conduit for exhausting said cooling gas from said cavity through said second plurality of ventilation apertures, a first mass flow controller in said gas inlet conduit, a second mass flow controller in said gas outlet conduit, a thermal sensor mounted in said ESC for sending a signal indicative of a temperature of said cooling gas in said cavity to a controller, and a controller adadted to cause an increase in cooling gas flow when a temperature rise in the cooling gas is detected by opening said second mass flow controller.

2. An apparatus for controlling wafer temperature in a plasma etcher according to claim 1, wherein said apparatus is used to control the temperature of said wafer during a plasma-on state.

3. An apparatus for controlling wafer temperature in a plasma etcher according to claim 1 further comprising a pump in fluid communication with said second mass flow controller for evacuating said cooling gas.

4. An apparatus for controlling wafer temperature in a plasma etcher according to claim 1, wherein said cooling gas is an inert gas.

5. An apparatus for controlling wafer temperature in a plasma etcher according to claim 1, wherein said cooling gas is helium.

6. An apparatus for controlling wafer temperature in a plasma etcher according to claim 1, wherein said first mass flow controller, said first and second plurality of ventilation apertures and said second mass flow controller form a helium cooling loop.

7. An apparatus for controlling wafer temperature in a plasma etcher according to claim 1 further comprising apresure gauge in said gas inlet conduit for sensing a presure and sending a signal controller.

8. An apparatus for controlling wafer temperature in a plasma etcher according to claim 1, wherein said flow rates through said first and second mass flow controllers determine a cooling gas leak rate.

* * * * *